(12) United States Patent
Xiang

(10) Patent No.: US 6,410,938 B1
(45) Date of Patent: Jun. 25, 2002

(54) SEMICONDUCTOR-ON-INSULATOR DEVICE WITH NITRIDED BURIED OXIDE AND METHOD OF FABRICATING

(75) Inventor: Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/824,932

(22) Filed: Apr. 3, 2001

(51) Int. Cl.[7] ............... H01L 29/04; H01L 31/036; H01L 29/12; H01L 21/76
(52) U.S. Cl. ............... 257/49; 428/620; 438/407; 438/423
(58) Field of Search .................. 438/151–166, 438/407, 423; 257/347, 49; 428/620

(56) References Cited

U.S. PATENT DOCUMENTS

| | | | |
|---|---|---|---|
| 5,468,657 A | * | 11/1995 | Hsu |
| 5,567,638 A | * | 10/1996 | Lin et al. |
| 5,629,221 A | * | 5/1997 | Chao et al. |
| 5,885,877 A | * | 3/1999 | Gardner et al. |
| 6,043,138 A | * | 3/2000 | Ibok |

\* cited by examiner

Primary Examiner—Richard Booth
(74) Attorney, Agent, or Firm—Renner, Otto, Boisselle & Sklar, LLP

(57) ABSTRACT

A semiconductor-on-insulator (SOI) device includes a buried insulator layer and an overlying semiconductor layer. At least parts of the buried insulator layer include a nitrided semiconductor oxide. The nitrided semiconductor oxide may be formed by means of a nitride implant with sufficient energy to pass through a surface semiconductor layer and penetrate into a buried oxide layer. Following the nitride implant the device may be annealed to remove damage to the surface semiconductor layer, as well as to form a high quality nitrided oxide in the buried insulator layer. The nitrided semiconductor oxide material may reduce or prevent depletion of dopant material from portions of the surface semiconductor layer, such as from channel portions of NMOS transistors.

20 Claims, 2 Drawing Sheets

SEMICONDUCTOR-ON-INSULATOR DEVICE WITH NITRIDED BURIED OXIDE AND METHOD OF FABRICATING

BACKGROUND OF THE INVENTION

1. Field of Invention

The present invention relates to the manufacture of semiconductor devices, and in particular to methods of preventing dopant depletion in active regions of such devices.

2. Description of the Related Art

An insulated-gate field-effect transistor (IGFET), such as a metal-oxide semiconductor field-effect transistor (MOSFET), uses a gate electrode to control an underlying surface channel joining a source and a drain. The channel, drain and source are located in a semiconductor substrate, with the channel being doped oppositely to the drain and source. The gate electrode is separated from the semiconductor substrate by a thin insulating layer (i.e., a gate dielectric layer) such as an oxide. The operation of the IGFET involves application of an input voltage to the gate electrode, which sets up a transverse electric field in the channel in order to modulate the longitudinal conductance of the channel.

In typical IGFET fabrication processes, the source and drain are formed by introducing dopants of a second conductivity type (P or N) into the semiconductor substrate of a first conductivity type (N or P) using a mask. Other steps of IGFET fabrication processes, such as annealing, involve elevated temperatures.

During high temperature processing, dopant migration into buried oxide tends to occur. This dopant migration occurs at higher rates for dopant materials with low atomic weights, such as boron. As active surface semiconductor regions get increasingly thin, as in a fully-depleted SOI devices, the dopant migration can lead to undesirable front channel doping changes, as well as undesirable lowering of the threshold voltage of the unwanted back channel region.

SUMMARY OF THE INVENTION

A semiconductor-on-insulator (SOI) device includes a buried insulator layer and an overlying semiconductor layer. At least parts of the buried insulator layer include a nitrided semiconductor oxide. The nitrided semiconductor oxide may be formed by means of a nitride implant with sufficient energy to pass through a surface semiconductor layer and penetrate into a buried oxide layer. Following the nitride implant the device may be annealed to remove damage to the surface semiconductor layer, as well as to form a high quality nitrided oxide in the buried insulator layer. The nitrided semiconductor oxide material may reduce or prevent depletion of dopant material from portions of the surface semiconductor layer, such as from channel portions of NMOS transistors.

According to an aspect of the invention, a semiconductor device includes a surface semiconductor region, and a buried nitrided semiconductor oxide layer underlying at least part of the surface semiconductor region.

According to another aspect of the invention, a method of making a semiconductor device includes the steps of: providing a semiconductor-on-insulator (SOI) wafer with a surface semiconductor layer and a buried insulator layer; implanting a nitrogen-containing material into the buried insulator layer through the surface semiconductor layer; and annealing the device to form a nitrided compound within the buried insulator layer.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

A semiconductor-on-insulator (SOI) device includes a buried insulator layer, at least a portion of which includes a nitrided semiconductor oxide material. The nitrided semiconductor material serves to prevent or reduce migration of active-area dopants, such as low atomic weight element dopants like boron, into the insulator layer during fabrication of semiconductor devices such as transistors. The nitrided semiconductor oxide material may be formed by implanting nitrogen in a buried oxide layer, followed by annealing of the device.

Figure 1:
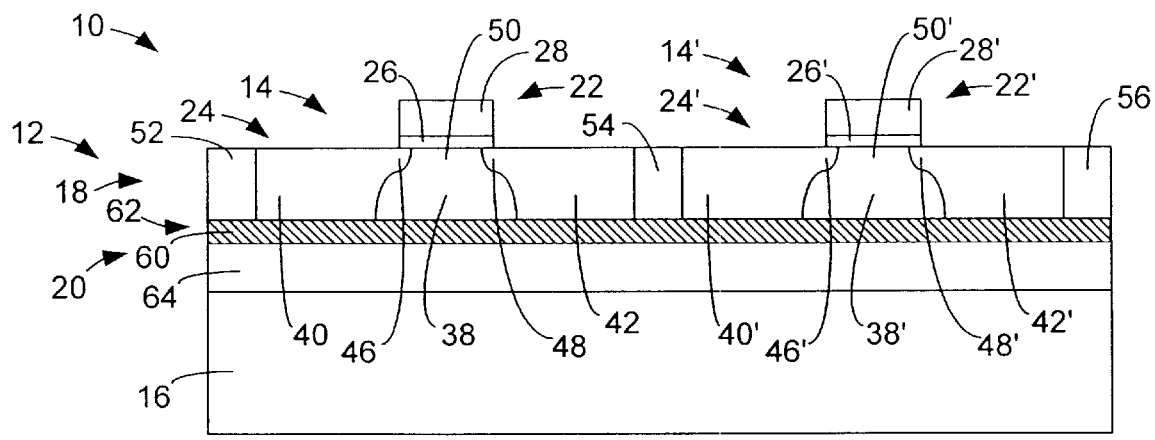
FIG. 1 is a side cross-sectional schematic view of a semiconductor device formed in accordance with the present invention.

Referring initially to FIG. 1, a semiconductor device 10 includes an SOI wafer 12 with an NMOS transistor 14 and a PMOS transistor 14' formed thereupon. The SOI wafer 12 includes a semiconductor substrate 16 and a surface semiconductor layer 18, with a buried insulator layer 20 therebetween. As is conventional, the semiconductor substrate 16 and the surface semiconductor layer 18 may be made of silicon and the buried insulator layer 20 may include a silicon oxide such as $SiO_2$, although it will be appreciated that other suitable materials may be used instead or in addition. Further, as described in greater detail below, the buried insulator layer 20 may have portions and/or layers that are composed of and/or include one or more other materials.

The NMOS transistor 14 includes a gate 22 formed on an active 100 semiconductor region 24 of the surface semiconductor layer 18. The active semiconductor region may have a thickness of between 50 Å and 1000 Å. The gate 22 includes a gate dielectric 26 and a gate electrode 28. Exemplary materials for the gate dielectric 26 are $SiO_2$ and $Si_3N_4$. The gate electrode 28 may be made of polysilicon or another semiconductor, or may be made in whole or in part of metal.

The active region 24 includes a body 38, with a source 40 and a drain 42 on respective opposite sides of the body. The source 40 and the drain 42 have respective source and drain extensions 46 and 48. The body includes a channel 50 between the source 40 and the drain 42 along the underside of the gate dielectric 26. The body 38 is of P-conductivity semiconductor material while the source 40 and the drain 42 are N-conductivity semiconductor material. Typical dopant materials for achieving N-type conductivity include P, As, and Sb. Typical dopant materials for achieving P-type conductivity include Al, Ga, B, $BF_2$, and In. Some of the dopants may be placed in the active layer 24 when the layer or semiconductor material is formed. Alternatively or in addition, the dopants for one or more of the regions may be added in a later processing step, such as in one or more implanting operations.

The source 40, the drain 42, and the channel 50, are operatively coupled with the gate 22 to function as a transistor. The source 40 and the drain 42 have respective source and drain electrically-conducting compound regions (also referred to as "silicide regions"), to facilitate electrical connection to the source and drain. The gate electrode 28 likewise may includes an upper conductive portion to facilitate electrical connection.

The active region 24 is laterally isolated from other structures of the device 10 by insulator-filled trenches 52 and 54 on opposite sides of the active region. The insulator-filled trenches 52 and 54 may be trenches filled with silicon dioxide ($SiO_2$), produced using known shallow trench isolation (STI) techniques. It will be appreciated that other suitable isolation structures and/or techniques may be used alternatively or in addition.

The PMOS transistor 14' may have similar structures, indicated by primed reference numerals, to those of the NMOS transistor 14 described above. The body 38' of the PMOS transistor 14' is of N-conductivity semiconductor material while the source 40' and the drain 42' are of P-conductivity semiconductor material. The active region 24' of the PMOS transistor 14' is laterally isolated from other structures by insulator-filled trenches 54 and 56 on opposite sides of the active region 24'.

As alluded to above, the insulator layer 20 includes a nitrided semiconductor oxide layer 60. The nitrided oxide layer 60 may be in an upper half 62 of the insulator layer 20, and may be in contact with the active semiconductor regions 24 and 24'. A substantially non-nitrided layer 64 of the insulator layer 20 may underlie the nitrided semiconductor oxide layer 60. The nitrided oxide layer 60 may have a thickness from about 20 Å to about 200 Å.

The nitrided semiconductor oxide layer 60 may advantageously reduce the tendency of dopant material to migrate from the active regions 24 and 24' to the insulator layer 20, such as during manufacturing operations involving heating. This because the nitrided semiconductor oxide material provides a greater diffusion barrier against dopant migration, when compared to non-nitrided semiconductor oxide material.

It will be appreciated that the nitrided semiconductor oxide layer 60 need not be a single continuous layer, but may include a number of discontinuous portions. For example, there may be discontinuities in the nitrided semiconductor material layer in parts of the buried insulator layer 20 underlying the insulator-filled trenches 52, 54, and 56. Alternatively or in addition, there may be discontinuities under one or more of the active regions, for example due to masking PMOS active semiconductor regions prior to the implanting of the nitrogen material.

The semiconductor device 10 shown in FIG. 1 and described above is but one example of semiconductor devices that may be produced with buried nitrided semiconductor material. It will be appreciated that many variants are possible. For example, the device may include a wide variety of NMOS and PMOS transistors in any of various configurations. Other semiconductor elements may be present.

Figure 2:
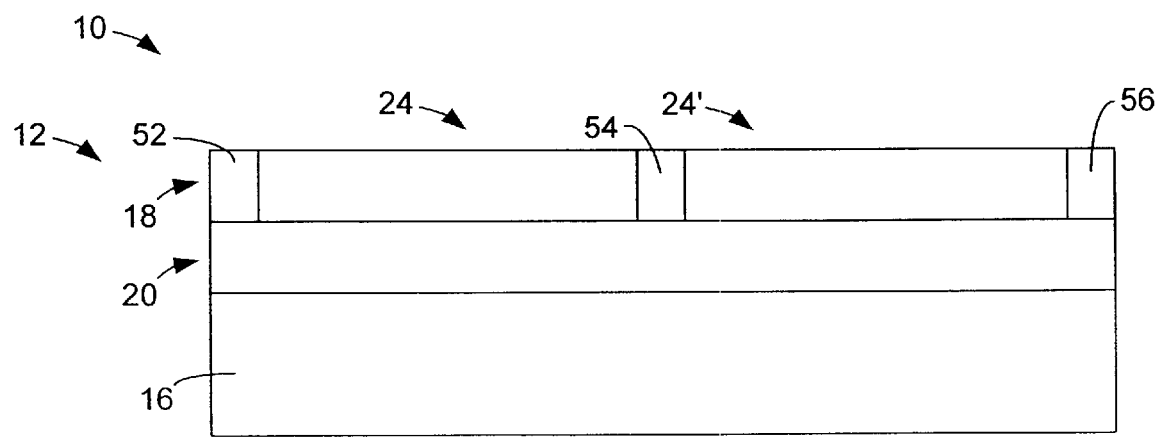
FIGS. 2–4 are side cross-sectional schematic views illustrating some of the steps of a method of fabricating the device of FIG. 1.
Figure 3:
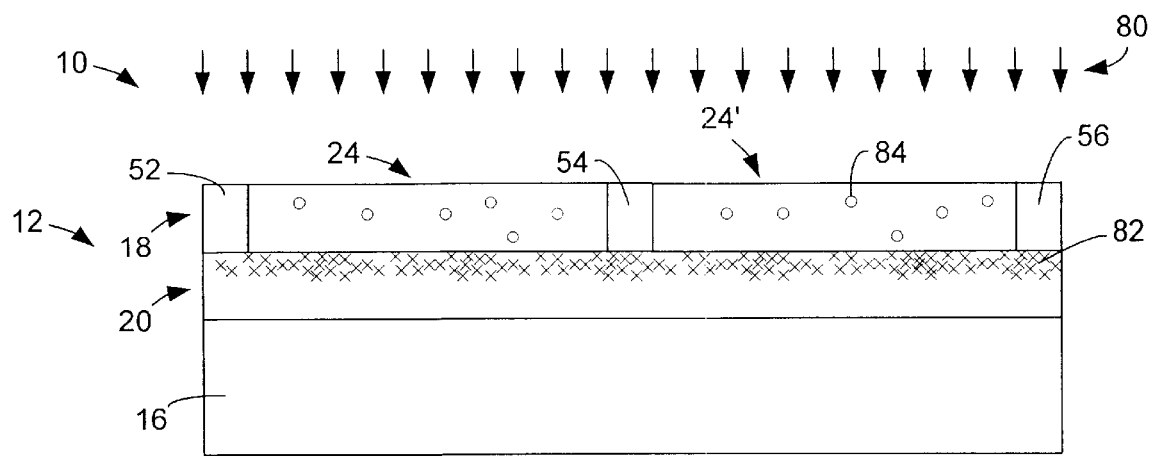
Figure 4:
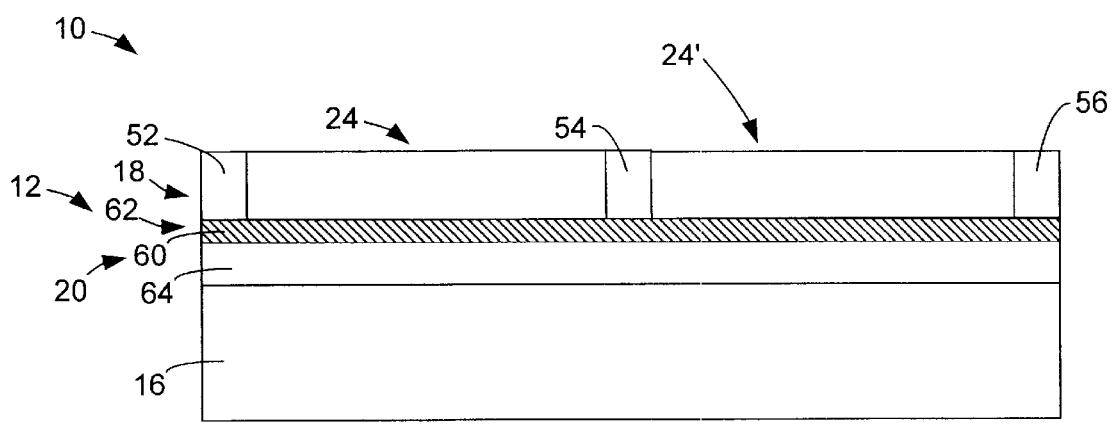

FIGS. 2–4 illustrate various steps involved in making the semiconductor device 10 shown in FIG. 1 and described above. Referring to FIG. 2, starting initially with the SOI wafer 12, the insulator-filled trenches 52–56 are created. It will be appreciated that there are many well-known sources and methods for producing SOI wafers such as the SOI wafer 12. The surface semiconductor layer 18 may be lightly doped by a dopant material, such as boron. The dopant included in the lightly-doped surface semiconductor layer 18 may be a P-type material or an N-type material.

The insulator-filled trenches 52–56 define and laterally isolated the active regions 24 and 24' of the surface semiconductor layer 18. The insulator-filled trenches 52–56 may be formed using conventional well-known shallow trench isolation (STI) techniques. An exemplary process for forming an insulating trench 52–56 includes forming a thin layer of oxide, approximately 150–200 Angstroms thick, on the wafer surface, and forming a silicon nitride mask thereon. The mask covers and protects the substrate in the area where the active regions 24 and 24' are to be formed while leaving exposed the area where the insulator-filled trenches 52–56.

Thereafter, the unmasked portions of the semiconductor surface layer 18 (e.g. the portions where the silicon nitride mask has been etched away) are etched away to form an open trench extending at least past the upper surface of the buried insulator layer 20. The etching process for a silicon substrate is typically an anisotropic dry etch using hydrogen bromide (HBr) which has selectivity characteristics such that it etches the silicon substrate but not the silicon nitride mask.

The open trench is filled by depositing silicon dioxide ($SiO_2$), formed by a chemical reaction involving $SiH_4$ or TEOS, to form insulating trenches 52–56. After filling the open trench the surface of the wafer is polished using a chemical mechanical polish to remove any excess silicon dioxide layer and the remaining silicon nitride mask.

It will be appreciated that the trenching may be performed at another point in the process, either earlier or later, if desired.

Turning now to FIG. 3, one or more implants of the nitrogen or nitrogen-containing material, such as an implant 80, are used to introduce nitrogen into the insulator layer 20, such as at locations indicated at 84. The implant(s) may also create defects in the active regions 24 and 24', such as indicated at 88.

The nitrogen-containing material may include, for example, $NH_3$ (ammonia) or $N_2$. The energy of the dopant ions may be from about 5 to about 500 keV, or may be from about 10 to about 100 keV. It will be appreciated that the energy of the implant will be dependant on the implant material and the thickness of the surface semiconductor layer 18.

With reference to FIG. 4, an annealing operation may then be performed on the semiconductor device 10. The annealing operation allows the nitrogen material 84 to combine with the semiconductor oxide material of the buried insulator layer to form the nitrided semiconductor oxide layer 60. The annealing may also remove the defects 88 in the active regions 24 and 24'. As an example, the annealing may be performed at a temperature from about 900 to about 1100° C., and may be performed for a time from about 5 to about 60 seconds, although it will be appreciated that other temperatures and/or times may be employed.

Following the annealing operation of FIG. 4, structures may be formed on the active regions 24 and 24', for example to create the transistors 14 and 14'. The structures may include well-known fabrication processes such as deposition, masking, etching, implanting, and annealing.

It will be appreciated that parts of the above-described methods may be employed to fabricate SOI wafers with doped buried insulator layers. Such wafers may be used to produce a variety of semiconductor devices.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A semiconductor device comprising:

a surface semiconductor region;

a bulk semiconductor layer underlying the surface semiconductor region;

a buried nitrided semiconductor oxide layer between the surface semiconductor region and the bulk semiconductor layer, and underlying at least part of the surface semiconductor region; and a non-nitrided semiconductor layer between the nitrided semiconductor oxide layer and the bulk semiconductor layer;

wherein the non-nitrided semiconductor layer is in contact with the bulk semiconductor layer.

2. The device of claim 1, wherein the buried nitrided semiconductor oxide layer is in contact with the surface semiconductor layer.

3. The device of claim 1, wherein the bulk semiconductor layer and the surface semiconductor layer are composed of silicon, wherein the nitrided semiconductor oxide layer includes nitrided $SiO_2$, and wherein the non-nitrided semiconductor oxide layer includes $SiO_2$.

4. The device of claim 1, wherein the surface semiconductor layer includes a source region, a drain region, and a body region between the source region and the drain region.

5. The device of claim 4, further comprising a gate on the surface semiconductor layer, the gate operatively coupled to the source region, the drain region, and the body region.

6. The device of claim 4, wherein at least one of the regions is a boron-doped region.

7. The device of claim 4, wherein the source region and the drain region are boron-doped regions.

8. The device of claim 4, wherein the body region is a boron-doped region.

9. The device of claim 1, wherein the buried nitrided semiconductor oxide layer has a thickness from 20 to 200 Å.

10. The device of claim 1, wherein the buried nitrided semiconductor layer is a continuous layer underlying at least two surface semiconductor regions.

11. The semiconductor device of claim 2, wherein a semiconductor oxide region consists exclusively of the nitrided semiconductor oxide layer and the non-nitrided semiconductor oxide layer; and wherein the nitrided semiconductor layer is fully within an upper half of the semiconductor oxide region.

12. The device of claim 1, wherein the surface semiconductor region has a thickness from 50 to 1000 Å.

13. A semiconductor device comprising:

a surface semiconductor region;

a bulk semiconductor layer underlying the surface semiconductor region; and a semiconductor oxide region between the surface semiconductor region and the bulk semiconductor layer;

wherein the semiconductor oxide region includes a nitrided semiconductor oxide portion and a non-nitrided semiconductor oxide portion;

wherein the nitrided semiconductor oxide portion is asymmetrically located within the semiconductor oxide region; with respect to depth within the semiconductor oxide region wherein one of the semiconductor oxide portions is in contact with the surface semiconductor region; and wherein the other of the semiconductor portions is in contact with the bulk semiconductor layer.

14. The semiconductor device of claim 13, wherein the nitrided semiconductor oxide portion is in contact with the surface semiconductor region; and wherein the non-nitrided semiconductor oxide portion is in contact with the bulk semiconductor layer.

15. The semiconductor device of claim 13, wherein the semiconductor oxide region consists exclusively of the nitrided semiconductor oxide portion and the non-nitrided semiconductor oxide portion;

wherein the nitrided semiconductor oxide portion is continuous; and wherein the non-nitrided semiconductor oxide portion is continuous.

16. The semiconductor device of claim 13, wherein the non-nitrided semiconductor portion is fully within an upper half of the semiconductor oxide region.

17. The device of claim 13, wherein the bulk semiconductor layer and the surface semiconductor layer are composed of silicon;

wherein the nitrided semiconductor oxide portion includes nitrided $SiO_2$; and wherein the non-nitrided semiconductor oxide portion includes $S:O_2$.

18. A semiconductor device comprising:

a surface semiconductor region;

a bulk semiconductor layer underlying the surface semiconductor region; and a semiconductor oxide region between the surface semiconductor region and the bulk semiconductor layer;

wherein the semiconductor oxide region is in contact with the surface semiconductor region;

wherein the semiconductor oxide region is also in contact with the bulk semiconductor layer; and wherein the semiconductor oxide region consists exclusively of a continuous nitrided semiconductor oxide portion and a continuous non-nitrided semiconductor oxide portion.

19. The semiconductor device of claim 18, wherein the nitrided semiconductor oxide portion is in contact with the surface semiconductor region; and wherein the non-nitrided semiconductor oxide portion is in contact with the bulk semiconductor layer.

20. The semiconductor device of claim 19, wherein the nitrided semiconductor oxide portion is fully within an upper half of the semiconductor oxide region.

* * * * *

UNITED STATES PATENT AND TRADEMARK OFFICE
CERTIFICATE OF CORRECTION

PATENT NO.    : 6,410,938 B1                                    Page 1 of 1
DATED         : June 25, 2002
INVENTOR(S)   : Xi Xiang It is certified that error appears in the above-identified patent and that said Letters Patent is hereby corrected as shown below:

Column 6,
Line 41, replace "S:" with -- Si --

Signed and Sealed this

Eleventh Day of February, 2003

JAMES E. ROGAN
*Director of the United States Patent and Trademark Office*